(12) United States Patent
Kim et al.

(10) Patent No.: US 6,815,783 B2
(45) Date of Patent: Nov. 9, 2004

(54) SINGLE TRANSISTOR TYPE MAGNETIC RANDOM ACCESS MEMORY DEVICE AND METHOD OF OPERATING AND MANUFACTURING THE SAME

(75) Inventors: Dong-wook Kim, Yongin (KR);
In-kyeong Yoo, Suwon (KR);
Jung-hyun Sok, Yongin (KR);
June-key Lee, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 11 days.

(21) Appl. No.: 10/252,532

(22) Filed: Sep. 24, 2002

(65) Prior Publication Data

US 2003/0076707 A1 Apr. 24, 2003

(30) Foreign Application Priority Data

Oct. 18, 2001 (KR) ........................................ 2001-64389

(51) Int. Cl.[7] .......................... H01L 29/82; H01L 43/00
(52) U.S. Cl. ................................ 257/421; 257/E27.006
(58) Field of Search ........................... 257/421, E27.006

(56) References Cited

U.S. PATENT DOCUMENTS 6,201,259 B1 * 3/2001 Sato et al. .................... 257/30

FOREIGN PATENT DOCUMENTS

JP 411266043 * 9/1999

* cited by examiner

Primary Examiner—David Nelms
Assistant Examiner—Tu-Tu Ho
(74) Attorney, Agent, or Firm—Lee & Sterba, P.C.

(57) ABSTRACT

A single transistor type magnetic random access memory device and a method of operating and manufacturing the same, wherein the single transistor type magnetic random access memory device includes a substrate, first and second doped regions spaced apart from each other, a gate dielectric layer on a portion of the semiconductor substrate between the first and second doped regions, a magnetic tunnel junction on the gate dielectric layer, word lines on the magnetic tunnel junction extending in a first direction which is the same direction as the second doped region, bit lines connected to the first doped region in a second direction perpendicular to the first direction, and an insulating layer covering the gate dielectric layer, the magnetic tunnel junction, and the word lines. The single transistor type magnetic random access memory device has a simple circuit structure, has a prolonged lifetime and is easy to manufacture.

3 Claims, 7 Drawing Sheets

—— HIGH RESISTANCE STATE(R1)
---- LOW RESITANCE STATE(R0)

SINGLE TRANSISTOR TYPE MAGNETIC RANDOM ACCESS MEMORY DEVICE AND METHOD OF OPERATING AND MANUFACTURING THE SAME

BACKGROUND OF THE INVENTION

1. Field of the Invention

The present invention relates to a single transistor type magnetic random access memory device and a method of operating and manufacturing the same. More particularly, the present invention relates to a single transistor type magnetic random access memory device for reading current values flowing through channels of a transistor having gates formed of magnetic tunnel junction (MTJ) cells instead of reading resistance values of the MTJ cells and methods of operating and manufacturing the same.

2. Description of the Related Art

A magnetic random access memory (MRAM), which is a nonvolatile memory device, uses a magnetic characteristic of a material to store data. In principle, the MRAM can realize both rapid reading/writing time of a static random access memory (SRAM) and high integration density of a dynamic random access memory (DRAM) and can rewrite data any time.

A conventional MRAM has a rapid rate and a low driving voltage, which are ideal characteristics for a memory device. However, since the conventional MRAM is formed by depositing several thin films, the structure thereof is complicated and the manufacture thereof is difficult. Also, the conventional MRAM uses tunnel current passing through a tunnel barrier to read a writing state. Thus, the life of the tunnel barrier is short and an additional circuit is required to read the tunnel current.

SUMMARY OF THE INVENTION

To solve the above-described problems, it is a first feature of an embodiment of the present invention to provide a single transistor type magnetic random access memory device for reading tunnel current values flowing through channels of a transistor having gates formed of magnetic tunnel junction (MTJ) cells instead of reading tunnel current flowing through conventional MTJ cells.

It is a second feature of an embodiment of the present invention to provide a method of operating the single transistor type magnetic random access memory device.

It is a third feature of an embodiment of the present invention to provide a method of manufacturing the single transistor type magnetic random access memory device.

Accordingly, to provide the first feature, there is provided a single transistor type magnetic random access memory device. The single transistor type magnetic random access memory device includes a substrate, first and second doped regions which are spaced apart from each other and are formed by implanting dopants into the semiconductor substrate, a gate dielectric layer formed on a portion of the semiconductor substrate between the first and second doped regions, an MTJ formed on the gate dielectric layer, word lines formed on the MTJ extending in a first direction which is a same direction as the second doped region, bit lines connected to the first doped region in a second direction perpendicular to the first direction, and an insulating layer for covering the gate dielectric layer, the MTJ, and the word lines to insulate the gate dielectric layer, the MTJ, and the word lines from the bit lines, wherein the first and second doped regions, the gate dielectric layer, and the MTJ constitute a single transistor.

It is preferable that the first doped region is disconnected from a first doped region of another transistor.

It is preferable that the word lines and the bit lines are formed of metal.

The single transistor type magnetic random access memory device may further include the metal strapping lines which are parallel to sources that are disposed parallel to the word lines and which are connected to sources in a predetermined number of memory devices.

To achieve the second feature, there is provided a method of operating a single transistor type magnetic random access memory device. The method includes: (a) applying current Ix to bit lines for addressing, applying current Iy to word lines, making magnetized directions of magnetic layers of an MTJ in an anti-parallel direction, forming a resistance $R_1$, and writing data "1" at a selected memory cell; (b) applying current Ix to the bit lines for addressing, applying current—Iy in a direction opposite to the current Iy to the word lines, making the magnetized directions of the magnetic layers of the MTJ in a parallel direction, forming a resistance $R_0$, and writing data "0" at a selected memory cell; and (c) applying a voltage Vds to the bit lines, applying a voltage Vin to the word lines, sensing channel current flowing from a drain that is a first doped region to a source that is a second doped region, and reading the data stored at the step (a) or (b).

It is preferable that (c) is performed by detecting the channel current via a sense amplifier connected to the source.

In (c), the channel current may be detected from metal strapping lines which are parallel to sources disposed parallel to the word lines and are connected to sources in a predetermined number of memory devices.

In (c), the channel may use a depletion mode MOSFET that is doped in advance, to precisely distinguish differences in the channel current due to the difference between the resistances $R_1$ and $R_0$.

In (c), a pulse voltage may be applied to the word lines to read changes in the channel current due to a time delay according to the resistances $R_1$ and $R_0$ during formation of the channel.

To provide the third feature, there is provided a method of manufacturing a single transistor type magnetic random access memory device. The method includes: (a) sequentially forming a gate dielectric layer and MTJ forming layers on a substrate; (b) forming a first insulating layer to cover the resultant layers of (a) on the substrate; (c) exposing an upper portion of the MTJ; (d) forming a word line on the exposed portion of the MTJ; (e) forming a second insulating layer on the first insulating layer to cover the word line; (f) forming a source and a drain by implanting dopants into portions of the substrate at both sides of the MTJ and the word line; (h) forming a third insulating layer, on the second insulating layer, which contacts the source and the drain and covers the stacked layers between the source and the drain; and (i) forming a bit line, on the third insulating layer, which contacts the drain.

It is preferable that (a) includes patterning the layers which are stacked.

It is preferable that (d) includes patterning the word line.

It is preferable that (f) includes: (f1) patterning the first and second insulating layers to expose portions of the substrate at both sides of the gate electric layer and the MTJ; and (f2) implanting dopants into the exposed portions of the substrate to form first and second doped regions which are a drain and a source, respectively, and are spaced apart from each other.

It is preferable that (i) includes: (i1) patterning the third insulating layer to expose the drain; and (i2) forming a conductive bit line, on the third insulating layer, which connects to the exposed drain.

BRIEF DESCRIPTION OF THE DRAWINGS

The above features and advantages of the present invention will become more apparent by describing in detail preferred embodiments thereof with reference to the attached drawings in which.

DETAILED DESCRIPTION OF THE INVENTION

Figure 1:
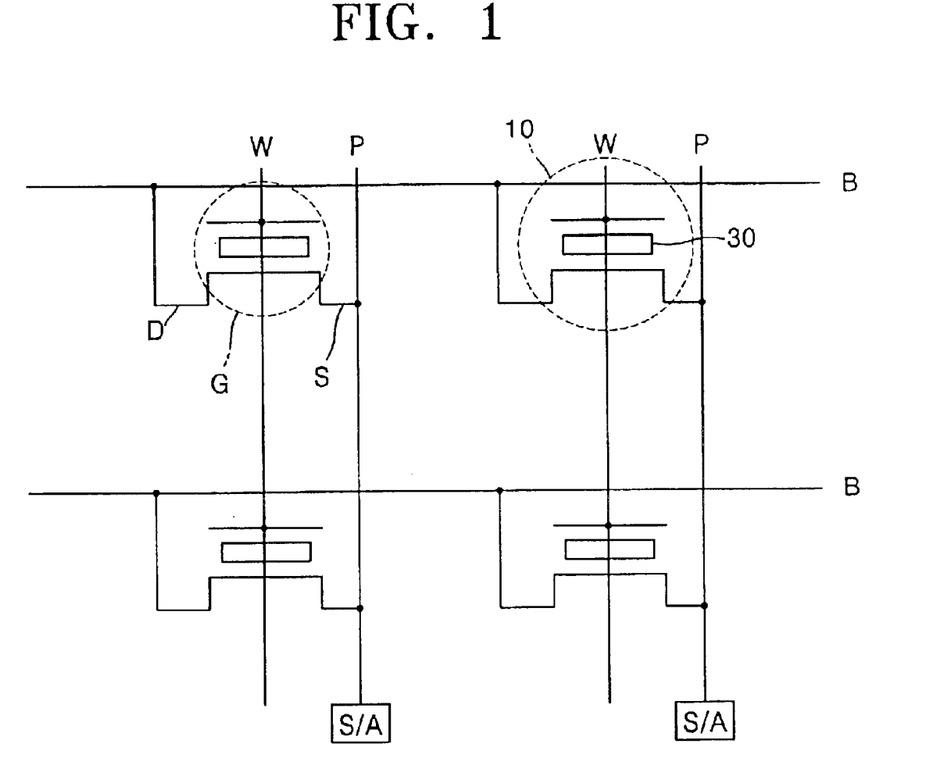
FIG. 1 illustrates a view of a cell array of a single transistor type magnetic random access memory device according to a preferred embodiment of the present invention.

Hereinafter, a single transistor type magnetic random access memory device and operating and manufacturing methods thereof will be described with reference to the attached drawings, in which:

FIG. 1 illustrates an equivalent circuit diagram of a cell array in a semiconductor chip having a memory transistor according to a preferred embodiment of the present invention. Reference numeral 10 denotes a single memory transistor and reference numeral 30 denotes an MTJ which will be described later. Reference numeral B denotes bit lines for connecting drains D of memory transistors 10 to each other and reference numeral W denotes word lines of the memory transistors 10. Reference numeral P denotes plate lines for straightly connecting sources S of cells which are parallel to the word lines W. A sense amplifier S/A is connected to the plate line P.

A cell array represents that a plurality of memory transistors 10 are arrayed lengthwise and crosswise. Thus, in the cell array, the word lines W corresponding to the number of crosswise arrayed memory transistors 10 and the bit lines B corresponding to the number of lengthwise arrayed memory transistors 10 are arrayed to be perpendicular to each other. The plate lines P are parallel to the word lines W as shown in FIG. 1. Each source S of each memory transistor 10 is connected to a means for measuring current flowing through channels. Preferably, this means is the sense amplifier S/A. However, other current measuring devices may be connected to each source S of each memory transistor 10.

Figure 2:
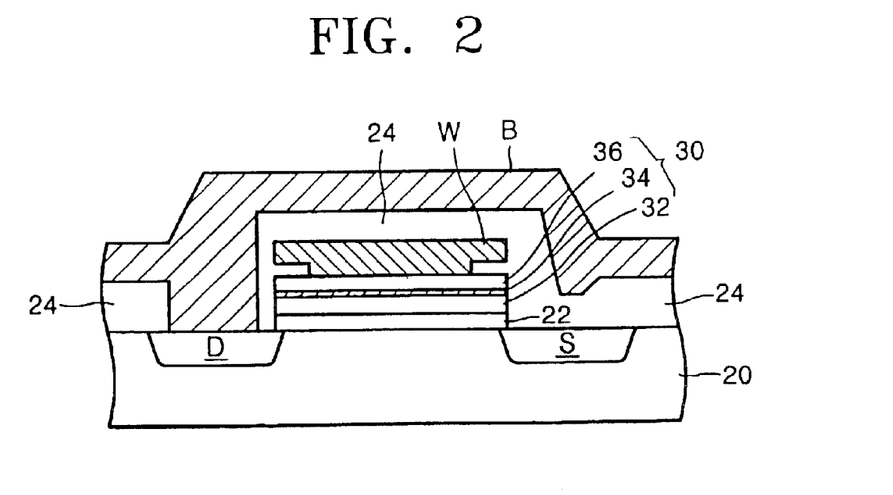
FIG. 2 illustrates a cross-sectional view of the single transistor type magnetic random access memory device according to a preferred embodiment of the present invention.

FIG. 2 illustrates a cross-sectional view of a single transistor type magnetic random access memory device according to the preferred embodiment of the present invention. Referring to FIG. 2, a memory transistor is formed on a substrate 20. A source S and a drain D are conductive doped regions which are formed from the surface of the substrate 20 to a predetermined depth. The source S and the drain D are spaced apart from each other. A gate dielectric layer 22 is formed on the surface of a portion of the substrate 20 between the source S and the drain D. An MTJ 30 is formed on the gate dielectric layer 22. A word line W, which extends in a first direction parallel to the source S, is formed on the MTJ 30. A bit line B, which is connected to the drain D, is formed over the word line W in a second direction perpendicular to the word line W. An insulating layer 24 is formed between the bit line B and the sequentially stacked dielectric layer 22, the MTJ 30, and the word line W. The insulating layer 24 insulates the dielectric layer 22, the MTJ 30, and the word line W from the bit line B. The word line W serves as a gate G shown in FIG. 1.

The MTJ 30 has a structure in which a tunnel barrier layer 34 is formed between two or more magnetic layers. The magnetized direction of a lower layer 32 of the MTJ 30 is fixed, and the magnetized direction of the upper layer 36 of the MTJ 30 becomes parallel or anti-parallel to the magnetized direction of the lower layer 32 by an applied electric field.

The drain D is disconnected from other drains to insulate cells from each other so that differences in current detected in a depletion mode, which will be described later, may easily be distinguished.

The word line W and the bit line B are formed of metal layers to supply current sufficient for switching.

An operation of a single transistor type magnetic random memory device according to a preferred embodiment of the present invention will now be described.

Writing Operation

Figure 3A:
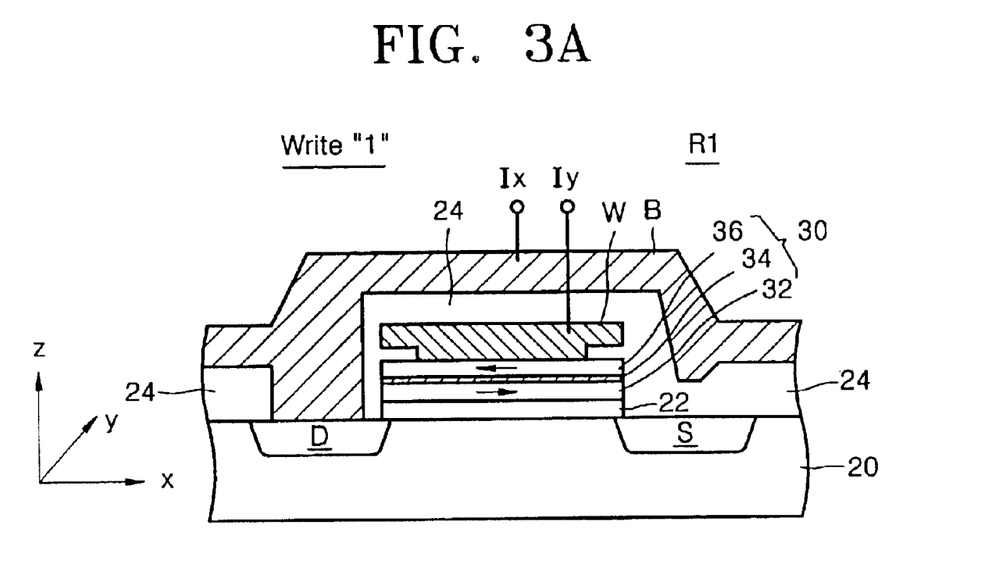
FIGS. 3A and 3B illustrate cross-sectional views explaining a writing operation of the single transistor type magnetic random access memory device according to a preferred embodiment of the present invention.

As shown in FIG. 3A, first current Ix is applied to a bit line B for addressing, and current Iy is applied to a word line W. Thus, direct current flows in a +y direction. As a result, a magnetic field is formed in a clockwise direction and thus the upper layer 36 of the MTJ 30 is magnetized in a −x direction, i.e., a left direction in FIG. 3A. Here, if the lower layer 32 of the MTJ 30 is magnetized in an +x direction, i.e., a right direction in FIG. 3A, the magnetic layers 32 and 36 are magnetized in anti-parallel directions as shown with arrows. Here, high resistance $R_1$ is formed in the MTJ 30 and data "1" is written in a selected memory cell.

Figure 3B:
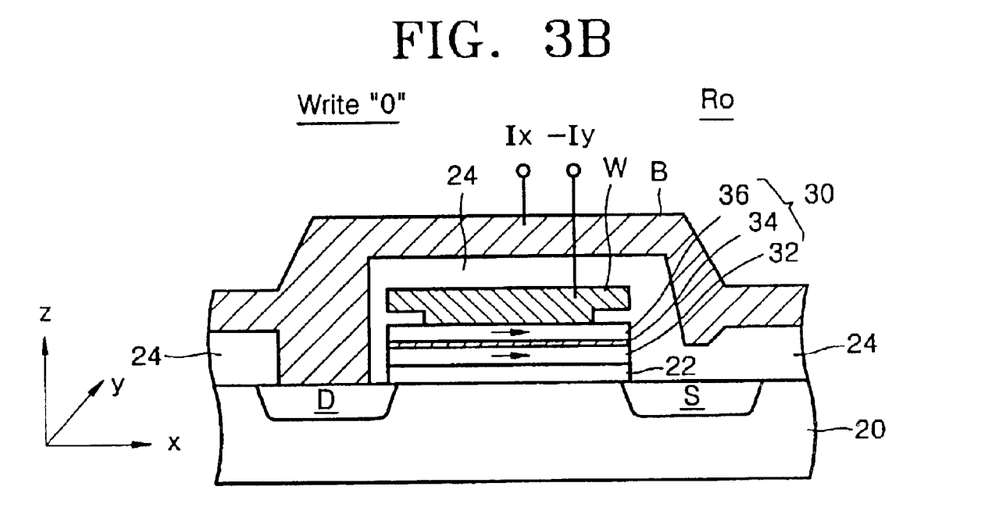

A process of writing data "0" in a memory cell will be described with reference to FIG. 3B. First, for addressing, current Ix is applied to a bit line B, and current −Iy in a direction opposite to the current Iy is applied to a word line W. As a result, a magnetic field is formed in a counterclockwise direction to magnetize the upper layer 36 of the MTJ in an x direction. Here, if the magnetized direction of the MTJ 30 is the x direction, the magnetized directions of the magnetic layers 32 and 36 are in parallel. Here, low resistance $R_0$ is formed in the MTJ 30 and data "0" is written in a selected memory cell.

Reading Operation

Figure 4:
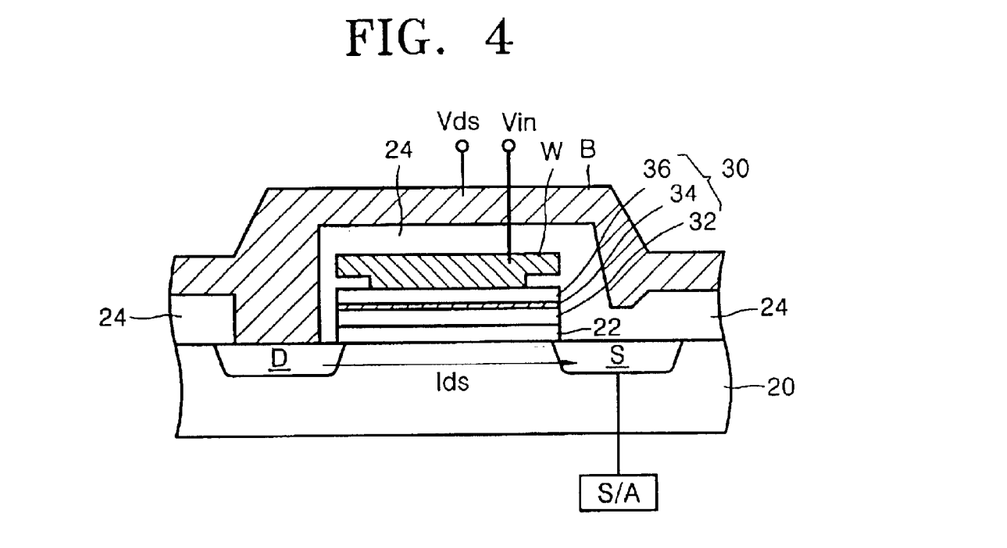
FIG. 4 illustrates a cross-sectional view explaining a reading operation of the single transistor type magnetic random access memory device according to a preferred embodiment of the present invention.
Figure 5:
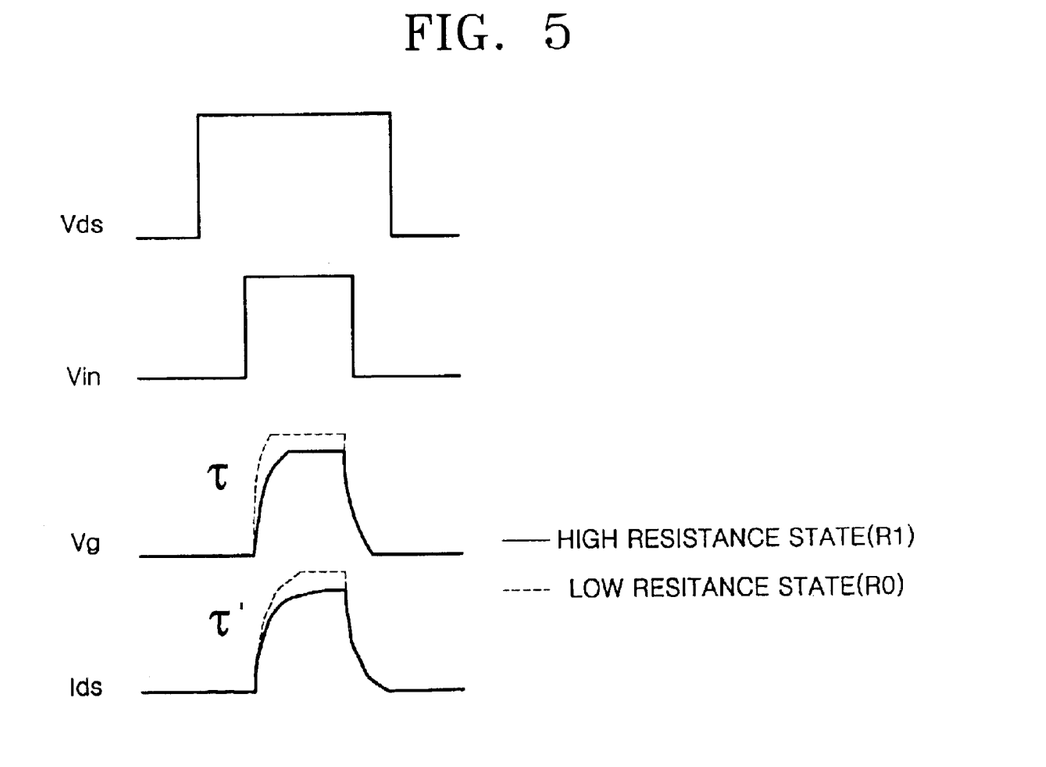
FIG. 5 illustrates a view showing changes in an applied voltage and a measured voltage during the reading operation of the single transistor type magnetic random access memory device according to a preferred embodiment of the present invention.

FIG. 4 illustrates a cross-sectional view for explaining a reading operation of the memory device according to a preferred embodiment of the present invention. FIG. 5 illustrates a view showing changes in an applied voltage and a measured voltage during the reading operation of the single transistor type magnetic random access memory device according to a preferred embodiment of the present invention.

Referring to FIGS. 4 and 5, first, a voltage Vds is applied to a bit line B. After the voltage Vds is stabilized, a voltage Vin is applied to a word line W. Then, a channel is formed between a source S and a drain D of a memory transistor. A sense amplifier S/A is connected to the source S to detect channel current Ids from the source S. The channel current Ids varies depending on resistances $R_1$ and $R_0$ of the MTJ 30 and thus "1" and "0" are distinguished from the channel current Ids. Here, a depletion mode transistor, in which a channel is doped in advance, may be used to precisely distinguish channel current values.

Due to the application of the voltage Vin to the word line W, a gate voltage Vg, which is delayed by a time constant τ, which is determined by the product of the resistances $R_1$ and $R_0$ of the MTJ 30 and gate capacitance (Cg), is applied to the gate dielectric layer 22. Thus, as shown in FIG. 5, resistance states of the MTJ 30 are distinguished by using different times for forming a channel according to the strength of the resistances $R_1$ and $R_0$ of the MTJ 30. As a result, it is possible to read data stored in a memory cell. In other words, channel current Ids, which is delayed by a time constant τ', or an integral value of the channel current Ids is read at a predetermined time starting after the voltage Vin is applied to the word line W to distinguish a resistance state $R_1$ or $R_0$. Also, channel current values may vary after the channel is formed. Thus, $R_1$ and $R_0$ values are distinguished by measuring the channel current values after the channel is formed.

Figure 6:
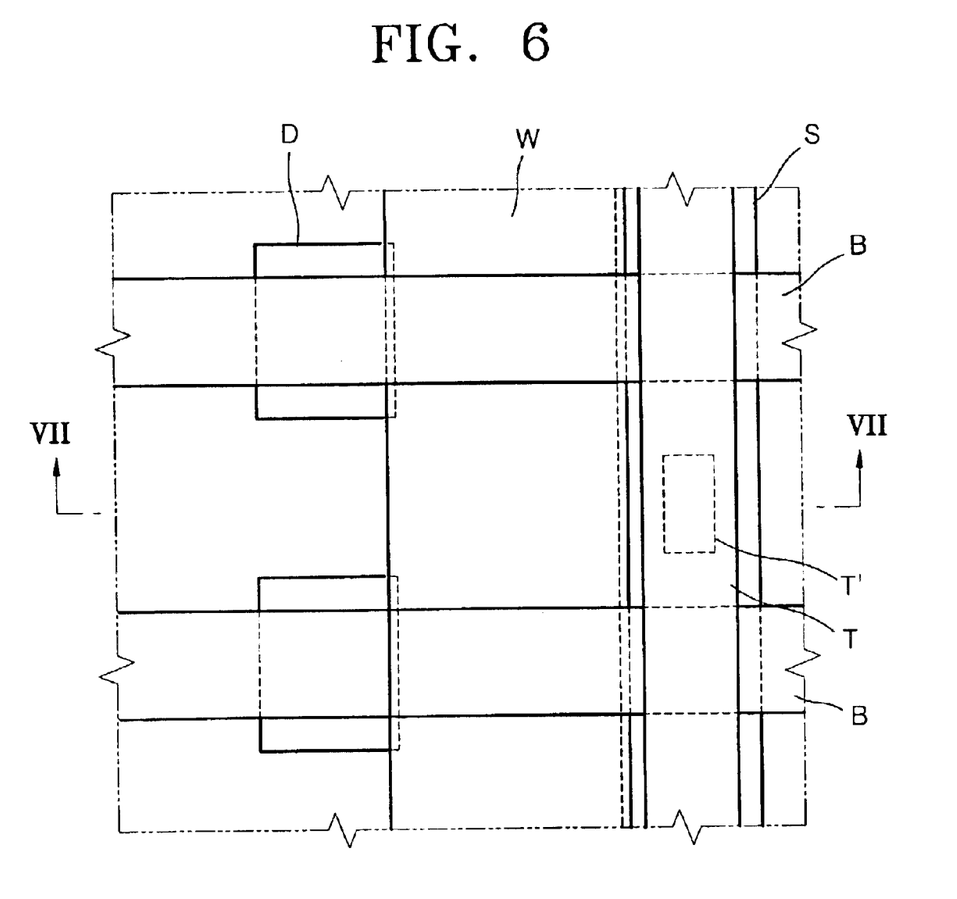
FIG. 6 illustrates a schematic plan view of a cell array of the single transistor type magnetic random access memory device according to a preferred embodiment of the present invention.
Figure 7:
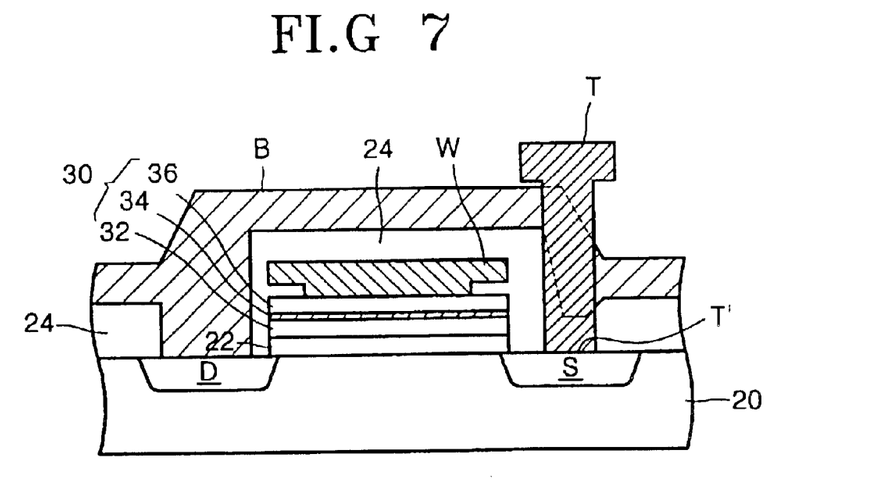
FIG. 7 illustrates a cross-sectional view taken along line VII—VII of FIG. 6.

The source S has a high resistance and thus a high-speed operation may be difficult in the source S. To solve this problem, as shown in FIGS. 6 and 7, metal strapping lines T which are low resistance lines are disposed parallel to the high resistance lines that are sources S. Next, the strapping lines T between bit lines in a predetermined number of memory devices are connected to the high resistance lines that are sources S under the strapping lines T. As a result, a time delay may be reduced. Reference numeral T' shown in FIGS. 6 and 7 denotes a contact surface between a source S and a strapping line T.

FIGS. 8A through 8H illustrate cross-sectional views for explaining a method of manufacturing the memory device of the present invention. Like reference numerals in the drawings denote like members, and their detailed description will be omitted.

Figure 8A:
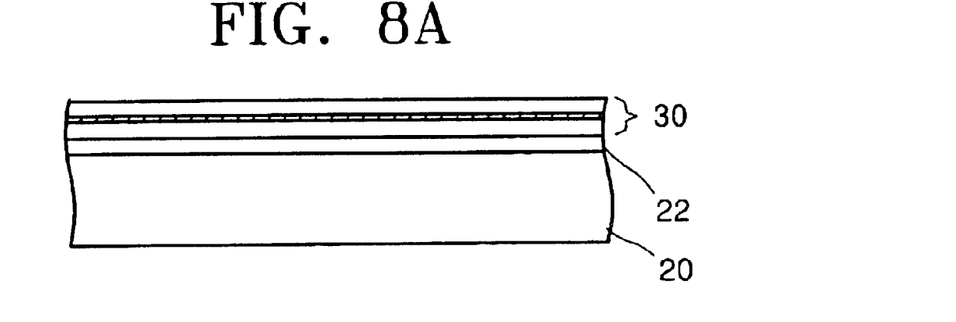
FIGS. 8A through 8H illustrate cross-sectional views explaining steps of a method of manufacturing the single transistor type magnetic random access memory device according to a preferred embodiment of the present invention.

As shown in FIG. 8A, a gate dielectric layer 22 and an MTJ 30 are sequentially formed on a semiconductor substrate 20.

Figure 8B:
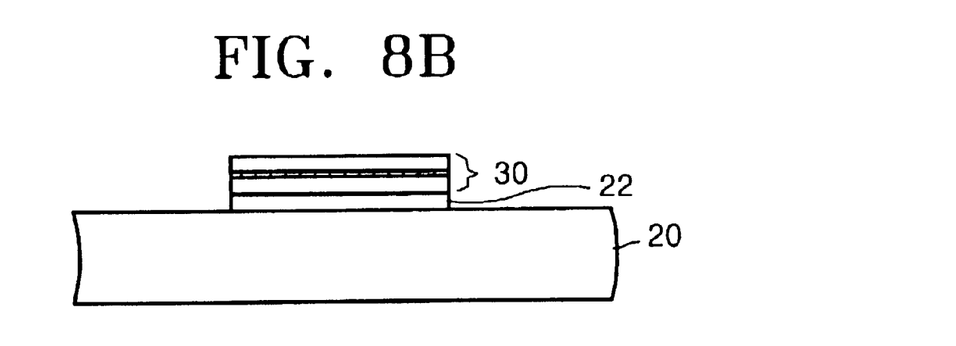

The stacked layers on the substrate 20 are patterned as shown in FIG. 8B.

Figure 8C:
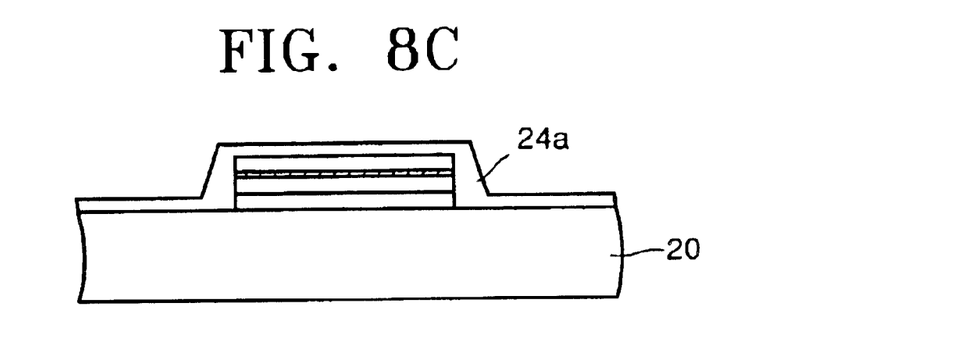

Then, a first insulating layer 24a is formed to cover the patterned layers on the substrate as shown in FIG. 8C.

Figure 8D:
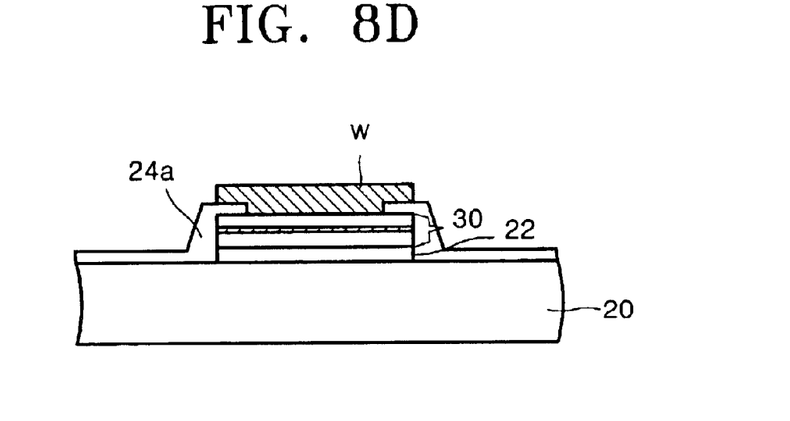

Thereafter, the first insulating layer 24a is patterned to expose an upper central portion of the MTJ 30, and a conductive word line W is formed on the exposed portion of the MTJ 30 and portions of the first insulating layer 24a. Next, the word line W is patterned as shown in FIG. 8D.

Figure 8E:
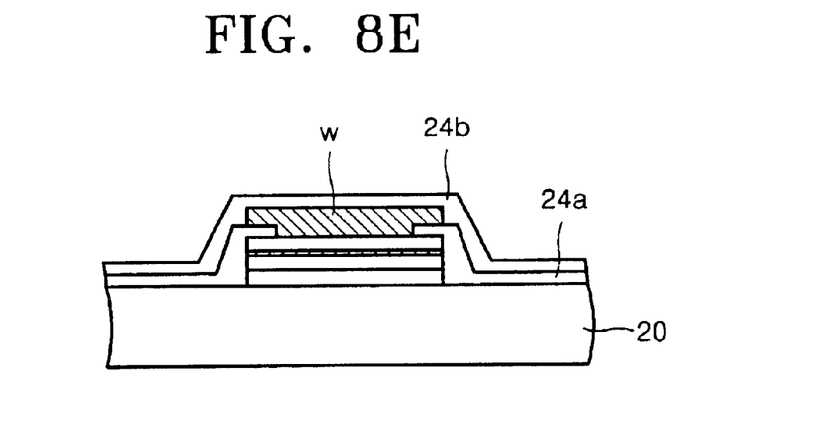

A second insulating layer 24b is formed on the first insulating layer 24a to cover the word line W as shown in FIG. 8E.

Figure 8F:
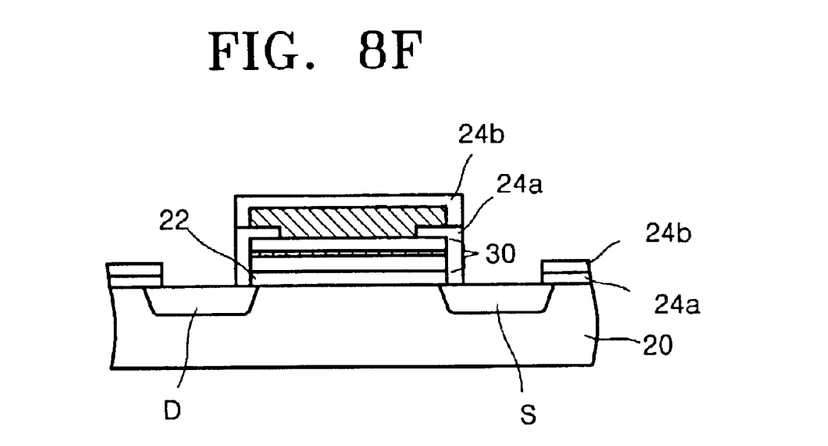

Then, the first and second insulating layers 24a and 24b are patterned so that portions of the substrate 20 at both sides of the stacked layers of the gate dielectric layer 22 and the MTJ 30 are exposed as shown in FIG. 8F.

Thereafter, dopants are implanted into the exposed portions of the semiconductor substrate 20 to form a first doped region and a second doped region which are a drain D and a source S, respectively, and are spaced apart from each other, as shown in FIG. 8F.

Figure 8G:
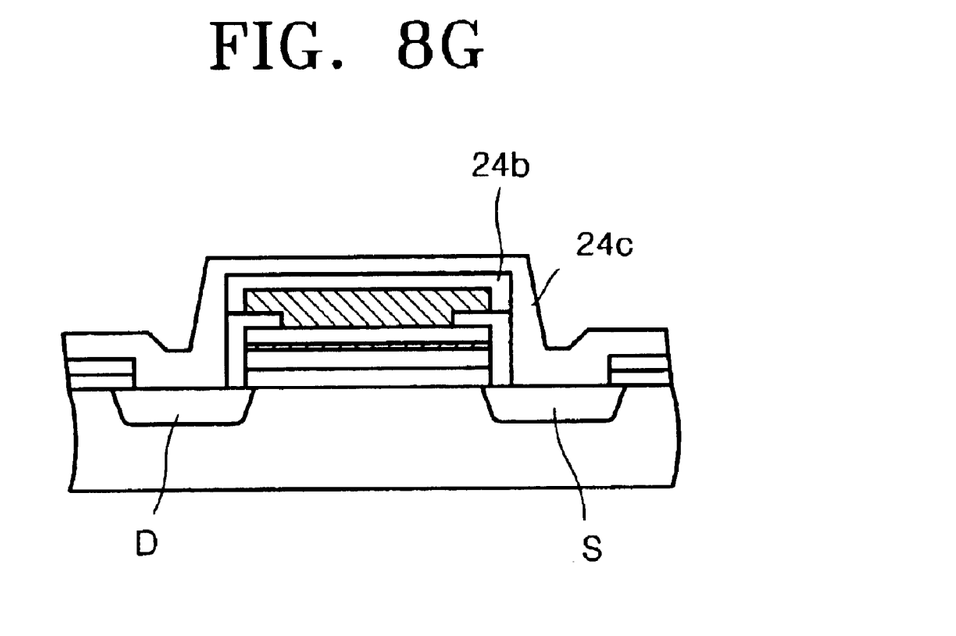

Next, a third insulating layer 24c is formed on the second insulating layer 24b to contact the source S and the drain D and cover the stacked layers between the source S and the drain D as shown in FIG. 8G.

Figure 8H:
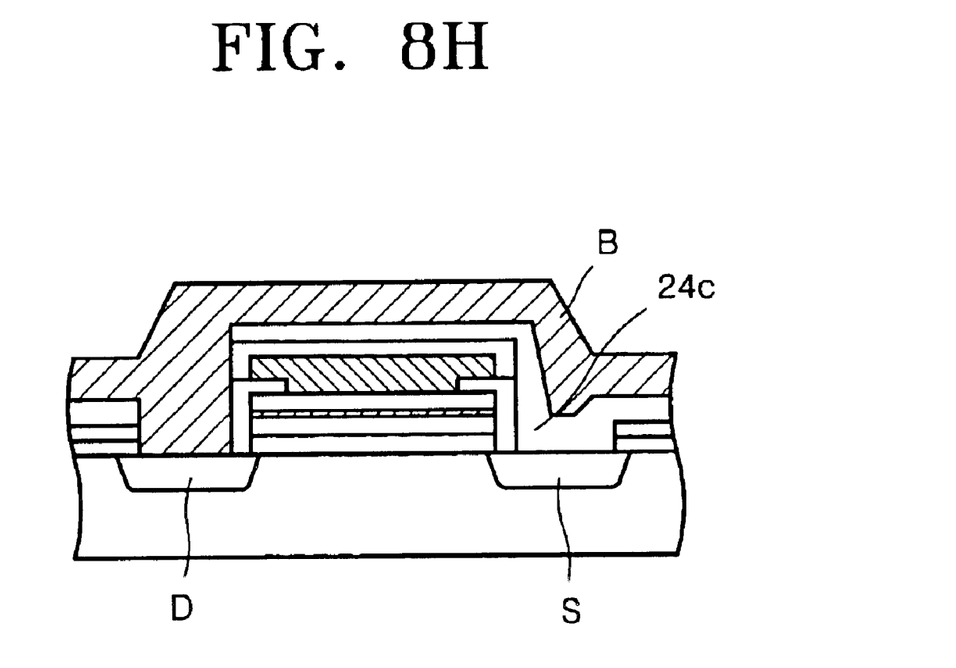

Then, the third insulating layer 24c is patterned to expose a portion of the drain D. Next, a conductive bit line B is formed to be connected to the exposed portion of the drain D, as shown in FIG. 8H. The conductive bit line B connects exposed portions of the plurality of drains D, in the cell array of FIGS. 1 and 6, to each other.

As described above, a single transistor type magnetic random access memory device has a simple circuit structure. Thus, it is easy to manufacture the single transistor type magnetic random access memory device having a highly integrated structure. Also, the life of the single transistor type random access memory device may be prolonged.

Preferred embodiments of the present invention have been disclosed herein and, although specific terms are employed, they are used and are to be interpreted in a generic and descriptive sense only and not for the purpose of limitation. The drawings referred to herein to describe the preferred embodiments of the present invention are used for illustration purposes only, and not for the purpose of limitation. Accordingly, it will be understood by those of ordinary skill in the art that various changes in form and details may be made without departing from the spirit and scope of the invention as set forth in the following claims

What is claimed is:

1. A single transistor type magnetic random access memory device comprising:

a substrate;

first and second doped regions which are spaced apart from each other and are formed by implanting dopants into the semiconductor substrate;

a gate dielectric layer formed on a portion of the semiconductor substrate between the first and second doped regions;

a magnetic tunnel junction formed on the gate dielectric layer;

word lines formed on the magnetic tunnel junction and extending in a first direction which is a same direction as the second doped region;

bit lines connected to the first doped region in a second direction perpendicular to the first direction;

an insulating layer for covering the gate dielectric layer, the magnetic tunnel junction, and the word lines to insulate the gate dielectric layer, the magnetic tunnel junction, and the word lines from the bit lines; and metal strapping lines which are parallel to sources disposed parallel to the word lines and are connected to sources in a predetermined number of memory devices, wherein the first and second doped regions, the gate dielectric layer, and the magnetic tunnel junction constitute a single transistor.

2. The single transistor type magnetic random access memory device as claimed in claim 1, wherein the first doped region is disconnected from a first doped region of another transistor.

3. The single transistor type magnetic random access memory device as claimed in claim 1, wherein the word lines and the bit lines are formed of metal.

* * * * *